US010311966B2

(12) United States Patent
Aipperspach et al.

(10) Patent No.: US 10,311,966 B2
(45) Date of Patent: Jun. 4, 2019

(54) ON-CHIP DIAGNOSTIC CIRCUITRY MONITORING MULTIPLE CYCLES OF SIGNAL SAMPLES

(71) Applicant: International Business Machines Corporation, Armonk, NY (US)

(72) Inventors: Anthony G. Aipperspach, Rochester, MN (US); Derick G. Behrends, Rochester, MN (US); Todd A. Christensen, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 605 days.

(21) Appl. No.: 15/050,169

(22) Filed: Feb. 22, 2016

(65) Prior Publication Data

US 2017/0242066 A1 Aug. 24, 2017

(51) Int. Cl.
*G01R 31/28* (2006.01)
*G11C 7/00* (2006.01)
(Continued)

(52) U.S. Cl.
CPC ........ *G11C 29/56016* (2013.01); *G11C 29/02* (2013.01); *G11C 29/022* (2013.01);
(Continued)

(58) Field of Classification Search
CPC . G11C 29/56016; G11C 29/02; G11C 29/022; G11C 29/023; G11C 29/025;
(Continued)

(56) References Cited

U.S. PATENT DOCUMENTS 5,787,092 A 7/1998 Jaynes et al.
6,317,852 B1 * 11/2001 Lau ....................... G11C 11/406
365/201
(Continued)

FOREIGN PATENT DOCUMENTS

GB 2476892 A 7/2011

OTHER PUBLICATIONS

Ghosh et al., "On-Chip Process Variation Detection and Compensation using Delay and Slew-Rate Monitoring Circuits", Quality Electronic Design, 2008, ISQED 2008, 9th International Symposium, pp. 815-820.

*Primary Examiner* — Melissa J Koval
*Assistant Examiner* — Rahul Maini
(74) *Attorney, Agent, or Firm* — Patterson + Sheridan, LLP

(57) ABSTRACT

A system and integrated circuits are provided for determining performance metrics over a plurality of cycles of an input signal using on-chip diagnostic circuitry. The system comprises a trigger generation module configured to generate a trigger signal, and diagnostic circuitry coupled with the trigger generation module. The diagnostic circuitry comprises a memory comprising a plurality of data lines, and a plurality of delay elements, each delay element of the plurality of delay elements connected between consecutive data lines of the plurality of data lines. The diagnostic circuitry is configured to receive at least one input signal, and write, upon receiving the trigger signal, values on the plurality of data lines to the memory, thereby acquiring samples of a plurality of cycles of the input signal.

20 Claims, 4 Drawing Sheets

(51) Int. Cl.
   *G11C 29/56* (2006.01)
   *G11C 29/02* (2006.01)
   *G11C 29/12* (2006.01)
   *G11C 29/46* (2006.01)
   *G01R 31/3187* (2006.01)

(52) U.S. Cl.
   CPC .......... *G11C 29/023* (2013.01); *G11C 29/025* (2013.01); *G11C 29/1201* (2013.01); *G11C 29/12005* (2013.01); *G11C 29/46* (2013.01); *G01R 31/3187* (2013.01); *G11C 2029/1208* (2013.01); *G11C 2029/5602* (2013.01)

(58) Field of Classification Search
   CPC .......... G11C 29/12005; G11C 29/1201; G11C 29/46; G11C 2029/1208; G11C 2029/5602; G01R 31/3187
   USPC ....................................................... 324/612
   See application file for complete search history.

(56) References Cited

U.S. PATENT DOCUMENTS

| | | |
|---|---|---|
| 7,368,931 B2 | 5/2008 | Kim |
| 7,694,203 B2 | 4/2010 | Liu et al. |
| 7,772,833 B2 | 8/2010 | Vijayaraghavan et al. |
| 7,973,549 B2 * | 7/2011 | Joshi ................ G01R 31/1726 324/750.3 |
| 8,531,196 B1 * | 9/2013 | Shelat .............. G01R 31/31725 324/750.3 |
| 2009/0018787 A1 * | 1/2009 | Chuang .............. G01R 31/3004 702/71 |
| 2011/0234282 A1 | 9/2011 | Chopra |

* cited by examiner

FIG. 5

ON-CHIP DIAGNOSTIC CIRCUITRY MONITORING MULTIPLE CYCLES OF SIGNAL SAMPLES

BACKGROUND

The present disclosure relates to assessing chip performance using on-chip diagnostic circuitry, and more specifically, to determining performance metrics over a plurality of cycles of an input signal using the on-chip diagnostic circuitry.

SUMMARY

According to one embodiment of the disclosure, a system is disclosed that comprises a trigger generation module configured to generate a trigger signal, and diagnostic circuitry coupled with the trigger generation module. The diagnostic circuitry comprises a memory comprising a plurality of data lines, and a plurality of delay elements, each delay element of the plurality of delay elements connected between consecutive data lines of the plurality of data lines. The diagnostic circuitry is configured to receive at least one input signal, and write, upon receiving the trigger signal, values on the plurality of data lines to the memory, thereby acquiring samples of a plurality of cycles of the input signal.

According to another embodiment of the disclosure, an integrated circuit is disclosed that comprises a plurality of internal nets, each carrying a respective one of a plurality of signals, and diagnostic circuitry coupled with at least one of the plurality of internal nets. The diagnostic circuitry comprises slew rate diagnostic circuitry configured to generate, based on a selected signal of the plurality of signals, a slew rate signal comprising a pulse having a pulse width, the pulse width indicating a slew rate of the selected signal. The diagnostic circuitry further comprises a memory comprising a plurality of data lines, and a plurality of delay elements, each delay element of the plurality of delay elements connected between consecutive data lines of the plurality of data lines. The diagnostic circuitry is configured to write, upon receiving a trigger signal, values on the plurality of data lines to the memory, thereby acquiring a plurality of samples of the slew rate signal corresponding to a plurality of transitions of the selected signal.

According to yet another embodiment of the disclosure, an integrated circuit is disclosed that comprises a plurality of internal nets each carrying a respective one of a plurality of signals. The integrated circuit further comprises a fast-switching circuit configured to receive a selected signal of the plurality of signals and to produce a first output signal, the first output signal including a first transition responsive to a transition of the selected signal. The integrated circuit further comprises a slow-switching circuit configured to receive the selected signal and to produce a second output signal, the second output signal including a second transition responsive to the transition of the selected signal. The integrated circuit further comprises a pulse generating circuit configured to generate a pulse based on the first and second transitions, and diagnostic circuitry comprising a memory having a plurality of data lines and a plurality of address lines. The diagnostic circuitry is configured to acquire a plurality of samples of the generated pulse in the memory.

BRIEF DESCRIPTION OF THE SEVERAL VIEWS OF THE DRAWINGS

FIG. 5 depicts an exemplary memory storing acquired samples at multiple address lines, according to one embodiment.

DETAILED DESCRIPTION

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, any reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

According to various embodiments, an integrated circuit can include diagnostic circuitry that is configured to measure and/or assess one or more metrics associated with the performance of the integrated circuit. For example, determining a duty cycle and/or a slew rate of signals internal to the integrated circuit can be beneficial to understand the effects of variable loading or variable drive circuitry relative to certain workloads or operational conditions. Understanding the changes occurring within signal parameters like duty cycle and/or slew rate can allow the operation of the integrated circuit to be improved, made more efficient, compensated, etc. while maintaining suitable signal quality (e.g., reduced variation between cycles, reduced jitter, etc.).

Figure 1:
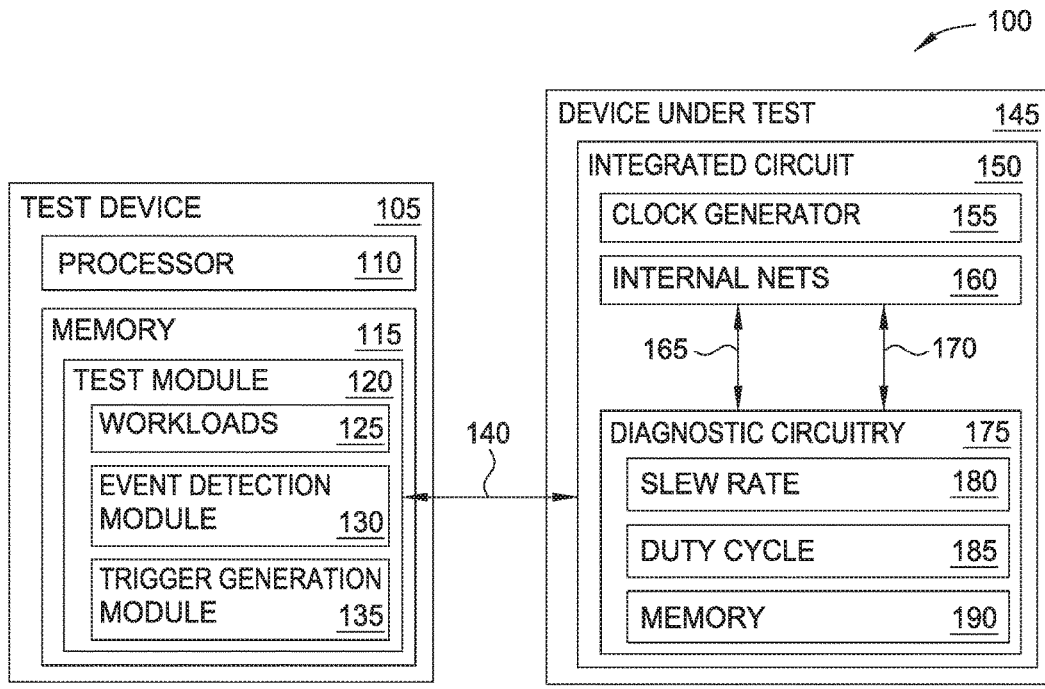
FIG. 1 depicts an exemplary system for assessing performance of an integrated circuit, according to one embodiment.

FIG. 1 depicts an exemplary system for assessing performance of an integrated circuit, according to one embodiment. System 100 includes a test device 105 coupled with a device under test (DUT) 145. The test device 105 can be dedicated test equipment or may alternately represent any suitable computing device configured to receive performance assessment data from the device under test 145 and/or provide test data to control the operation of the device under test 145 (or the operation of one or more components thereof). In some embodiments, the test device 105 is further configured to associate received performance assessment data with the current operational state of the device under test 145, which can support optimizing the operation of the DUT 145. The test device 105 and device under test 145 are communicatively coupled through connection(s) 140 representing one or more communicative connections using wireline, wireless, optical, and/or any other suitable communication medium.

The test device 105 comprises a processor 110 and memory 115. Processor 110 may have any suitable form, such as a general purpose microprocessor having one or more cores, a controller, an application-specific integrated circuit (ASIC), and so forth. Memory 115 may include a variety of computer-readable media selected for their size, relative performance, or other capabilities: volatile and/or non-volatile media, removable and/or non-removable media, etc. Memory 115 may include one or more modules for performing various functions described herein. The modules generally include program code that is executable by the processor 110. As shown, memory 115 includes a test module 120 that is configured to control operation of the DUT 145 and/or assess performance data provided by the diagnostic circuitry 175.

The test module 120 may control operation of the DUT 145 by providing specific testing workloads 125 for operating the DUT 145. For example, workloads 125 may include predetermined sets of instructions and/or data that are loaded into firmware or other memory of integrated circuit (IC) 150. Some workloads 125 can be representative of "normal" operation of the IC 150, while other workloads 125 may represent heavier or lighter loading of the IC 150. The test module 120 includes an event detection module 130 configured to determine when one or more predetermined operational conditions are met during operation of the IC 150, which then can be associated with a particular workload 125. Some non-limiting examples of detected events can relate to particular conditions or states within the workload 125, such as detecting a load-store operation, detecting a cache-miss, detecting a predetermined numeric function, and so forth. Other non-limiting examples of detected events need not be associated with the workload 125, and can include transitioning the IC 150 out of a reduced power operational mode (or "waking up" the IC 150). In some embodiments, the event detection module 130 instructs, upon detecting a particular event, the trigger generation module 135 to generate a trigger signal that in turn signals the diagnostic circuitry 175 to begin operation. The detected event may be associated with the performance data acquired by the diagnostic circuitry 175 to better understand and control operation of the device under test 145.

The device under test 145 may include a single integrated circuit (or "chip") or multiple chips (e.g., same chips during wafer-scale testing, an electronic device assembly having different types of chips). The integrated circuit 150 may have any form factor and suitable functionality. The integrated circuit 150 includes a clock generator 155 that is configured to generate a clock signal 165 used by one or more components of the IC 150. The IC 150 also includes a plurality of internal nets 160 comprising conductive elements such as traces connecting one or more components of the IC 150. During operation of the IC 150, each internal net 160 can carry different control and/or data signals, such as the clock signal 165 and one or more other signals 170.

The integrated circuit 150 further includes diagnostic circuitry 170 that is configured to measure and/or assess one or more metrics associated with performance of the IC 150. Determining a duty cycle and/or a slew rate of signals (which measure the relative positioning of signal transitions and length of signal transitions, respectively) carried on the internal nets 160 can be beneficial to understand the effects of variable loading or variable drive in response to certain workloads 125. Some non-limiting examples of variable loading include content addressable memory (which has different loading depending on data values stored in the memory), input/output (I/O) driver circuitry that is configured to perform impedance matching, coupling of wire loads (e.g., according to the Miller effect), and so forth. A non-limiting example of variable driving includes operating IC 150 according to different power modes (e.g., decreased voltages). Understanding the changes occurring in signal parameters like duty cycle and/or slew rate over time and/or relative to the current operation of the integrated circuit 150 can allow the operation of the integrated circuit 150 to be improved, made more efficient, compensated, etc. in order to maintain suitable signal quality (e.g., reduce variation between cycles, reduce jitter, etc.). Further, the determined slew rate may be indicative of the relative drive strength of p-type and n-type metal-oxide-semiconductor (PMOS and NMOS) devices that are included in the IC 150.

The diagnostic circuitry 175 may include separate circuitry corresponding to determining different metrics. For example, diagnostic circuitry 175 includes slew rate diagnostic circuitry 180 ("slew rate") and duty cycle diagnostic circuitry 185 ("duty cycle"). In some embodiments, the diagnostic circuitry 175 used for different metrics can have one or more shared circuitry elements. Diagnostic circuitry 175 includes a memory 190 that is configured to store a plurality of samples of one or more signals. In some embodiments, multiple signal samples are stored at different address lines of the memory 190, with different address lines corresponding to different cycles of the sampled signal. The acquired signal samples may be later accessed, e.g., by the test module 120 or other processing elements to assess the metrics and to associate the metrics with the operational state of the diagnostic circuitry (e.g., particular workloads 125, detected events by event detection module 130, etc.). In one embodiment, memory 190 is a static random-access memory (SRAM). In other embodiments, memory 190 can be any alternate type of memory able to write multiple samples of the input signal suitably fast to capture the frequency/data rate of signals carried on the internal nets 160.

Although system 100 is depicted as generally occurring within a testing environment during production of the device under test 145, in other embodiments, the diagnostic circuitry 175 may be used after production of the IC 150 is completed. Further, in some embodiments, some or all of the functionality of test module 120 may be included in the device under test 145 and/or IC 150. For example, during operation of the IC 150, one or more metrics can be determined using the diagnostic circuitry 175, which are subsequently used to dynamically adjust the operation of the IC 150.

Figure 2:
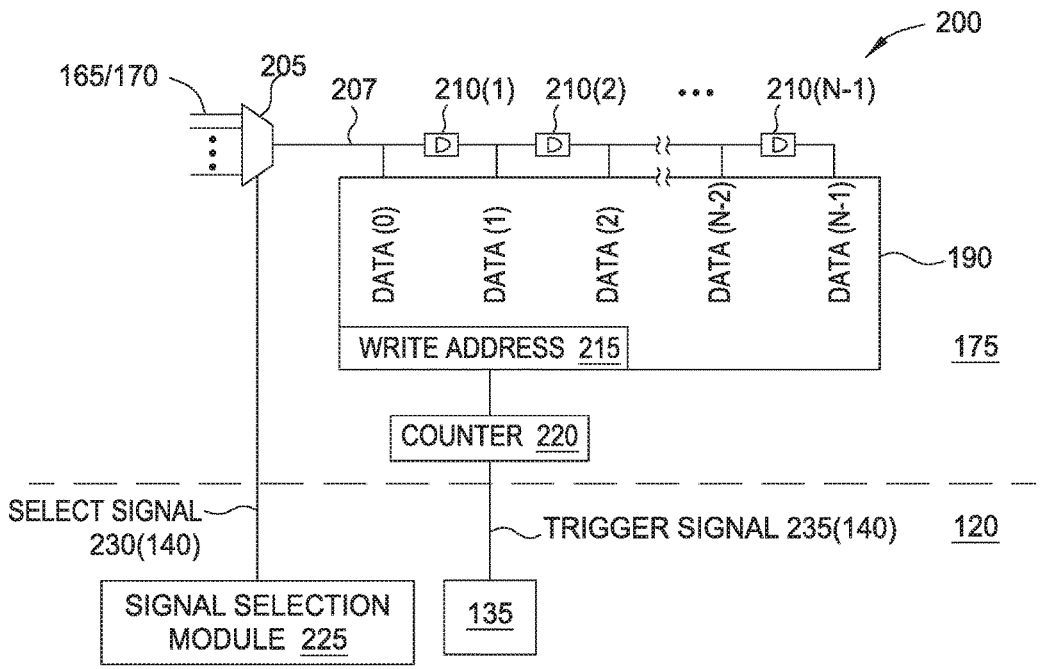
FIG. 2 depicts an exemplary arrangement having diagnostic circuitry interfaced with a test module, according to one embodiment.

FIG. 2 depicts an exemplary arrangement having diagnostic circuitry interfaced with a test module, according to one embodiment. More specifically, arrangement 200 illustrates operation of diagnostic circuitry 175 with test module 120 to acquire a plurality of signal samples.

During operation of the associated integrated circuit, various signals such as clock signal 165 and/or other signals 170 are generated. The diagnostic circuitry 175 may be configured to sample some or all of these signals 165/170 to assess performance of the integrated circuit. In one embodiment, a multiplexer 205 or other suitable switching circuitry allows a particular one of multiple signals 165/170 to be selected for sampling into memory 190. The test module 120 may include a signal selection module 225 configured to provide a select signal 230 to the multiplexer 205 to select which of the signals 165/170 will be sampled.

Memory 190 is an (M×N) memory including a first number (M) of address lines and a second number (N) of data lines (i.e., Data(0), Data(1), . . . , Data(N−1)). The memory 190 may be selected such that the number of data lines provides a suitable number of samples of the selected signal 207 (e.g., corresponding to a 32-bit data word, 64-bit, 128-bit, etc.). The selected signal 207 is coupled with the plurality of data lines through a plurality of delay elements 210(1) to 210(N−1), each of which separates consecutive data lines. The delay elements 210 may have any suitable form, such as a conductive element having an associated RC time constant, an inverter, or a buffer. In some embodiments, each of the delay elements 210 corresponds to substantially the same amount of delay, although this is not a requirement. In some embodiments, the sampling period (T) used to capture a transition of the selected signal 207 may dictate the amount of delay for each of the delay elements 210 (e.g., on the order of T/N or less). If the sampling period is small, the corresponding amount of delay may be so small as to require use of "faster" delay elements, such as the conductive element. Some example delay periods for different implementations of delay elements 210 include about 5-8 picoseconds (ps) for inverters, about 10-15 ps for buffers, and less than 1 ps for conductive (wire) elements.

Upon receiving a trigger signal 235 from the trigger generation module 135, the diagnostic circuitry 175 is configured to write values of the selected signal 207 onto the N data lines to acquire a plurality of samples of the selected signal 207. In some embodiments, information contained in the trigger signal 235 can be used to select particular address line(s) of the memory 190 at which to write the plurality of samples. In some embodiments, the trigger signal 235 causes diagnostic circuitry 175 to begin a predetermined sequence in which a counter 220 is used to sequentially select a plurality of address lines, and a plurality of samples of the selected signal 207 are stored at each write address 215. In some embodiments, the samples stored at a first address line correspond to a first cycle of the selected signal 207 and the samples stored at a second address line correspond to a second cycle of the selected signal 207. The second cycle may be a cycle immediately following the first cycle, or another later cycle. By acquiring data corresponding to different cycles of the selected signal 207, time changes to metrics such as duty cycle and slew rate for the selected signal 207 may be determined and associated with the workloads, detected events, etc. of the associated IC. An example of writing acquired samples to multiple address lines of memory 190 is discussed further with respect to FIG. 5, below.

In some embodiments, the arrangement 200 is configured to determine a duty cycle of the selected signal 207, as well as any changes thereto over subsequent cycles of the selected signal 207. For example, the delay elements 210 may be selected and/or tuned such that the diagnostic circuitry 175 is configured to detect transitions (i.e., rising and/or falling edges) of the selected signal 207. In some embodiments, rising and falling edges of a clock signal 165 can be detected where two consecutive data lines have the same value, within an otherwise alternating pattern of logical ones (1s) and zeros (0s). The sampled values on the data lines may be further processed to highlight the rising and/or falling edges of the signal. Using the example of clock signal 165, the values sampled on consecutive data lines may be processed through exclusive-NOR (XNOR) gates such that the two consecutive data lines having the same value produce a single logic "high" value. Thus, the location of the "high" values in the resulting signal (separated by a number of "low" values where no transition occurred) shows the relative location of the transition(s), which can be used to determine the duty cycle and track the duty cycle over time.

Figure 5:
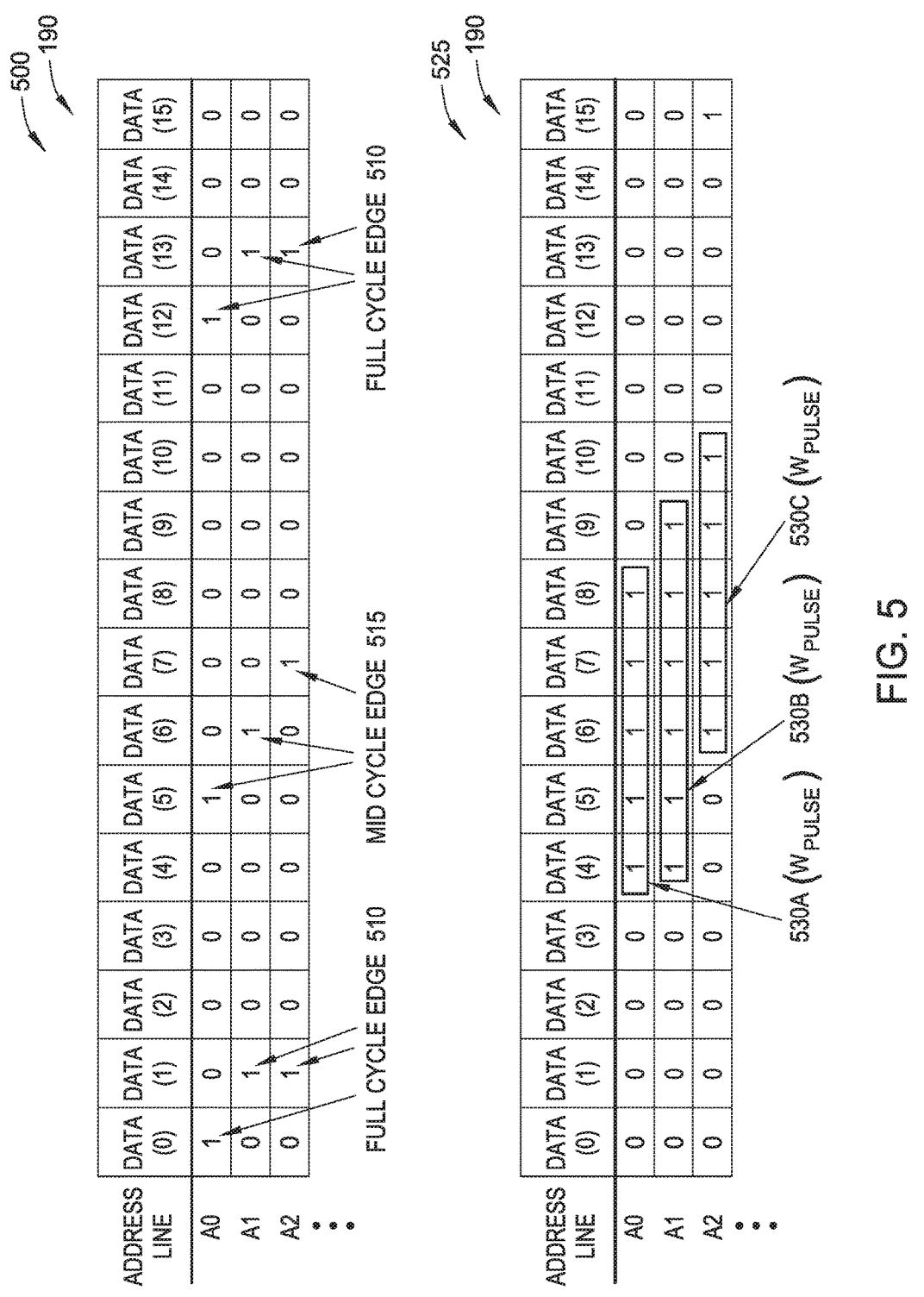

Referring now to graph 500 of FIG. 5, memory 190 is depicted as having sixteen data lines (Data (0)-Data (15)) and at least three address lines A0, A1, A2. The contents of memory 190 include processed samples corresponding to multiple cycles of a selected input signal. Each address line A0, A1, A2 includes a plurality of logic "1" values representing distinct transitions of the input signal, as a full cycle edge 510, mid cycle edge 515, and another full cycle edge 510. The full cycle edge 510 may represent one of a rising edge and a falling edge transition of the input signal, and the mid cycle edge 515 may represent the other of a rising edge and a falling edge transition.

Although the different transitions are each represented as single logic "1" values, assume for purposes of this example that the processing of the input signal samples is able to distinguish between the different types of transitions within a particular cycle. This may be based on timing of the transitions (e.g., at or near an expected time for a particular type of transition) and/or other processing. For example, using the XNOR and clock signal example provided above, consecutive "1" sampled input signal values can represent a rising edge transition, and consecutive "0" values can represent a falling edge. Although consecutive "0" values and consecutive "1" values each produce a "1" when XNORed together, such as in memory 190, the original input signal can be used to distinguish the type of transition.

Each address line A0, A1, A2 corresponds to samples of a different cycle of the input signal and can show changes in signal metrics with respect to operational conditions. In some embodiments, the values in graph 500 can be used to determine a duty cycle of the input signal. Assume for this example that the full cycle edge 510 represents a rising edge transition and the mid cycle edge 515 represents a falling edge transition. The cycles captured in A0 and A1, although shifted by one sample, have approximately the same duty cycle. After the particular sample capturing the rising edge transition (A0/data(0), A1/data(1)), the input signal remains "high" for four samples (i.e., no transition) before a falling edge transition at A0/data(5), A1/data(6). The input signal remains "low" for six samples before the subsequent rising edge transition at A0/data(12), A1/data(13). Thus, for the cycles captured in A0/A1, the input signal has a roughly 40% duty cycle (four "high" samples to six "low" samples). This is only a simplified example, and other factors may be present to improve the quality of the duty cycle determination (e.g., a memory with a greater number of data lines, accounting for the periods associated with sampling the transitions in the duty cycle calculation). The duty cycle changes in the cycle captured in A2 to a roughly 50% duty cycle (five "high" samples and five "low" samples). The contents of memory 190 may be subsequently accessed to associate the current operational conditions of the integrated circuit with the values and/or changes in the duty cycle of the input signal.

Figure 3A:
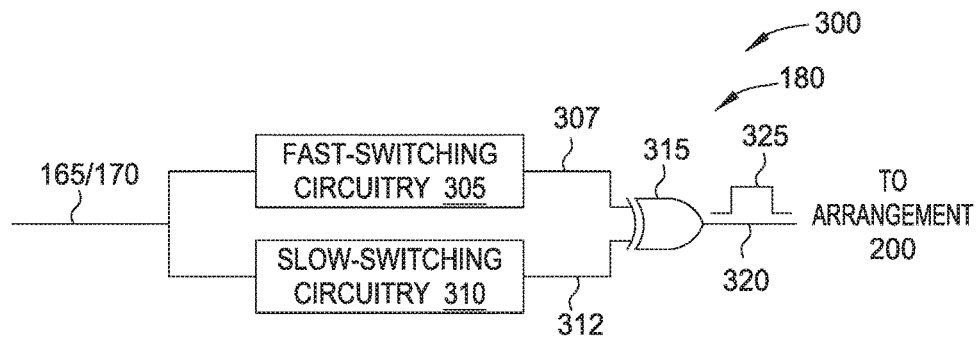
FIG. 3A depicts an exemplary arrangement of slew rate diagnostic circuitry, according to one embodiment.

FIG. 3A depicts an exemplary arrangement of slew rate diagnostic circuitry, according to one embodiment. More specifically, the arrangement 300 provides one possible implementation of the slew rate diagnostic circuitry 180 configured to produce a slew rate signal 320 from an input signal. The slew rate signal 320 includes a pulse 325 having a pulse width that indicates the slew rate of the particular input signal.

The slew rate diagnostic circuitry 180 receives an input signal (i.e., a selected one of signals 165/170; referred to here as input signal 165/170), and the input signal 165/170 is provided to both fast-switching circuitry 305 and slow-switching circuitry 310. Generally, fast-switching circuitry 305 may be any circuitry configured to indicate a transition of the input signal more quickly than the slow-switching circuitry 310 indicates the transition. In some embodiments, the slew rate diagnostic circuitry 180 is a multiple threshold voltage ($V_t$) circuit, with fast-switching circuitry 305 having a lower $V_t$ (thus indicating the transition earlier) than the $V_t$ of slow-switching circuitry 310. Fast-switching circuitry 305 produces an output signal 307, and slow-switching circuitry 310 produces an output signal 312, and the difference in switching timing between the output signals 307, 312 is converted into a pulse 325 by exclusive-OR (XOR) gate 315. For example, during a transition of the input signal 165/170, output signal 307 transitions first because of the lower threshold voltage $V_t$ of fast-switching circuitry 305. Output signal 312 transitions after output signal 307 because of the greater threshold voltage $V_t$ of slow-switching circuitry 310. Since the different threshold voltage $V_t$ values are known, the time difference between reaching each threshold voltage $V_t$ generally indicates the slew rate of the input signal 165/170. The XOR gate 315 then translates this time difference into the pulse width of a pulse 325 in the slew rate signal 320. Thus, component properties and configurations of the fast-switching circuitry 305 and slow-switching circuitry 310 may be selected to suitably detect the transition of the input signal 165/170 and to produce a pulse 325 of suitable width. The generated slew rate signal 320 may be provided to the arrangement 200, e.g., as a selectable input signal to the optional multiplexer 205.

Figure 3B:
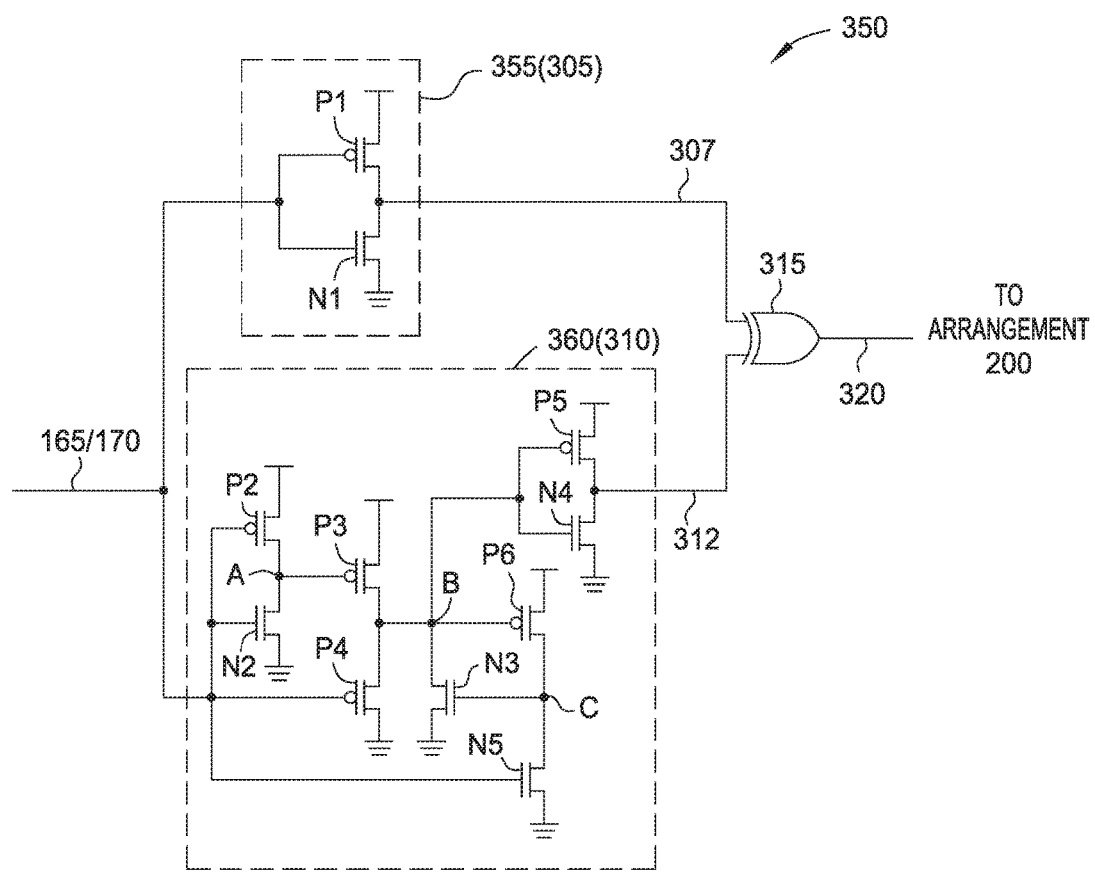
FIG. 3B depicts an exemplary arrangement of fast-switching circuitry and slow-switching circuitry, according to one embodiment.

FIG. 3B depicts an exemplary arrangement of fast-switching circuitry and slow-switching circuitry, according to one embodiment. More specifically, the arrangement 350 provides one possible implementation of fast-switching circuitry 305 and slow-switching circuitry 310 of the slew rate diagnostic circuitry 180. Other implementations of fast-switching circuitry 305 and slow-switching circuitry 310 are possible; for example, the slow-switching circuitry 310 could have a similar arrangement of components as fast-switching circuitry 305 but with relatively slower switch times. Fast-switching circuitry 305 includes an inverter 355 having a first PMOS field-effect transistor (PFET) P1 and a first NMOS field-effect transistor (NFET) N1. The source terminal of P1 is connected with a first voltage rail (described as $V_{DD}$), and the source terminal of N1 is connected with a second voltage rail (described as ground).

In some embodiments, to ensure that fast-switching circuitry 305 does in fact switch faster than slow-switching circuitry, one or both of P1 and N1 may be selected as low threshold voltage (LVT) devices. Additionally or alternatively, the relative device dimensions, doping concentrations, etc. of P1 and N1 may be selected to suitably skew operation of the inverter 355 (i.e., skew the β-ratio of P1 and N1). Depending on the direction of transition (rising or falling) of the input signal 165/170, the inverter 355 starts transition after reaching the voltage threshold Vt for N1 or P1.

The slow-switching circuitry 310 includes a driver circuit 360 configured to sample a falling edge of the input signal 165/170. The driver circuit 360 includes PFETs P2-P6 and NFETS N2-N5. Other configurations of the driver circuit 360 may be possible, such as sampling a rising edge of the input signal 165/170 using a substantially complementary circuit, or a combination circuit configured to sample both rising and falling edges. To sample a rising edge of the input signal 165/170, a complement of driver circuit 360 having each PFET P2-P6 replaced by an NFET, and each NFET N2-N5 replaced by a PFET, may be used. In some embodiments, the arrangement 350 includes both rising edge and falling edge detection circuitry within the slow-switching circuitry 310.

Figure 4:
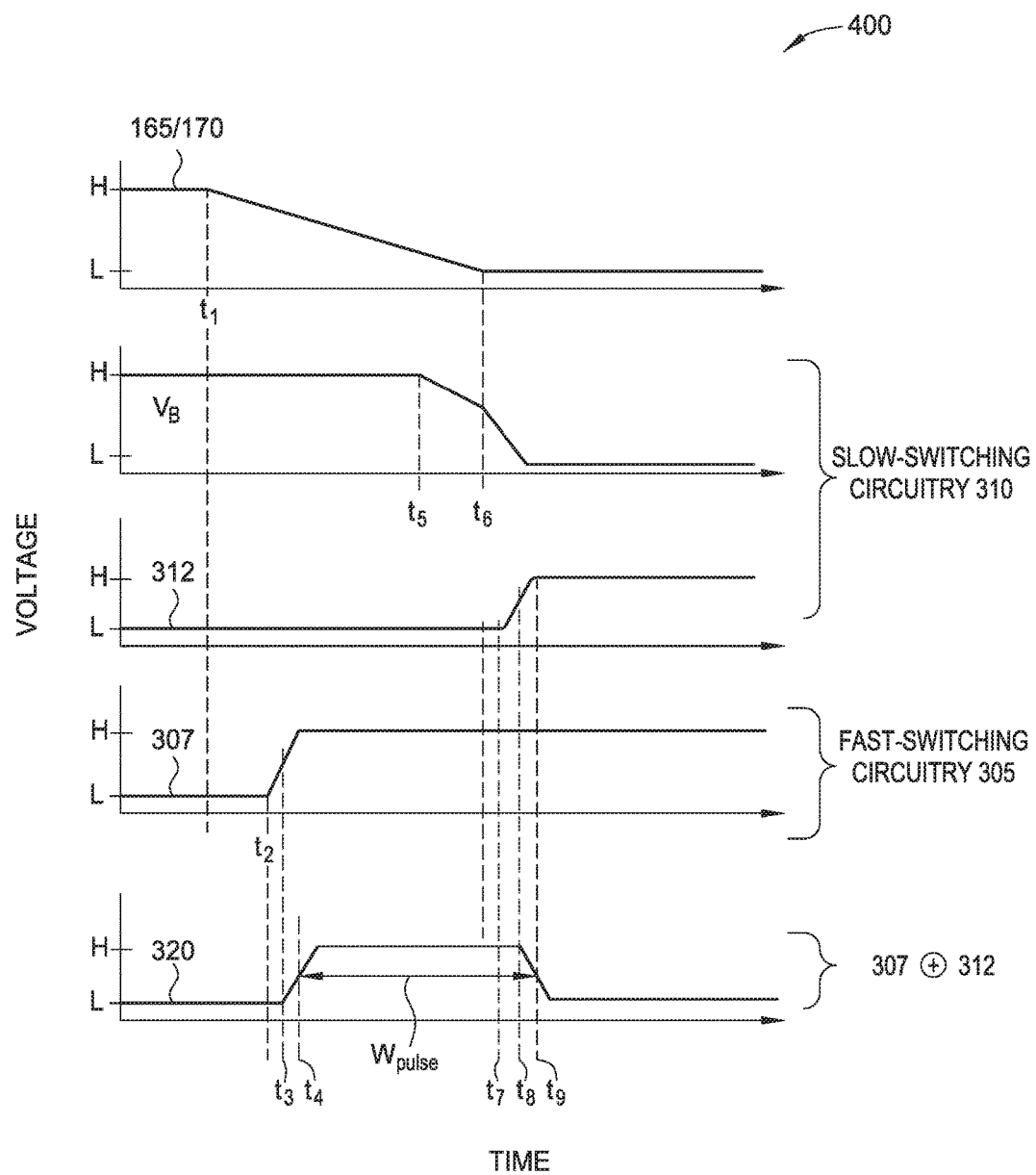
FIG. 4 depicts a graph illustrating exemplary operation of slew rate diagnostic circuitry to generate a slew rate signal, according to one embodiment.

FIG. 4 depicts a graph illustrating exemplary operation of slew rate diagnostic circuitry to generate a slew rate signal, according to one embodiment. More specifically, graph 400 shows operation of the arrangement 350 during a falling edge transition of an input signal 165/170 to produce slew rate signal 320.

Referring to both FIGS. 3B and 4, the input signal 165/170 is initially at a "high" (H) logic level (also a logic "one," $V_{DD}$, etc.). Within inverter 355, a "high" input signal 165/170 causes P1 to be non-conducting and N1 to be conducting, such that the output node is coupled with ground, and therefore the value of output signal 307 is a logic "low" (L) (a logic "zero," ground, $V_{SS}$, etc.). Within driver circuit 360, the "high" input signal 165/170 causes P2 and P4 to be non-conducting and N2 and N5 to be conducting, such that nodes A and C are each at a logic "low." The "low" node A causes P3 to be conducting, while the "low" node C causes N3 to be non-conducting, such that node B ($V_B$) is initially at a logic "high." In turn, the "high" node B causes P5 and P6 to be non-conducting and N4 to be conducting, such that output signal 312 is a logic "low." Because both output signals 307, 312 are at a logic "low," the slew rate signal 320 (i.e., output signal 307 XOR output signal 312) is also at a logic "low."

At time $t_1$, the input signal 165/170 begins its falling edge transition. At time $t_2$, the voltage of the input signal 165/170 reaches a threshold voltage ($V_t$) of inverter 355—specifically, the gate-to-source voltage ($V_{GS}$) value at which P1 begins conducting. The conductivity of N1 also decreases with the decreasing input signal 165/170, and thus the output signal 307 from inverter 255 begins to increase at time $t_2$.

At time $t_3$, the voltage of output signal 307 is sufficiently large that the XOR gate 315 reads the signal as a "high" input. Because the output signal 312 remains "low" at time $t_3$, XOR gate 315 begins the transition to a logic "high" value in the slew rate signal 320. At time $t_4$, the voltage of slew rate signal 320 is sufficiently large to be considered a "high" value when sampled.

Within the driver circuit 360, the decreasing input signal 165/170 reaches the threshold voltage $V_t$ of P2, causing P2 to begin conducting while N2 experiences reduced conductivity, which increases the voltage at node A. Increasing the voltage at node A causes the magnitude of $V_{GS}$ of P3 to be reduced, reducing the conductivity of P3. Additionally, at time $t_5$ the input signal 165/170 decreases past a threshold voltage of P4, so that P4 begins conducting node B to ground. The reduced conductivity of P3 and increased conductivity of P4 cause the node B voltage ($V_B$) to decrease at a first rate at time $t_5$.

Eventually, node B voltage $V_B$ decreases to a threshold voltage of P6 so that P6 begins conducting, coupling $V_{DD}$ with node C, while the decreasing input signal 165/170 reduces the conductivity of N5. The node C voltage increases through a threshold voltage of N3, which establishes a second conductive path from node B to ground. As a result, the node B voltage $V_B$ decreases at a second, greater rate at time $t_6$.

At time $t_7$, the node B voltage $V_B$ has decreased enough from $V_{DD}$ that P5 begins conducting and the conductivity of N4 is decreased, and the voltage on output signal 312 begins increasing from the logic "low." At time $t_8$, the voltage on output signal 312 reaches a level that is read by the XOR gate 315 as a "high" input. The XOR gate now has two "high" input and begins decreasing the slew rate signal 320 to a logic "low."

At time $t_9$, the voltage of slew rate signal 320 is decreased such that subsequent samples of the slew rate signal 320 will be considered a "low" input. Thus, the interval $t_4$-$t_9$ represents a pulse width $W_{pulse}$ that indicates a slew rate of the input signal 165/170.

In some embodiments, the slew rate signal 320 that is generated by arrangements 300 or 350 (FIGS. 3A and 3B) can be inputted into the arrangement 200 (FIG. 2) so that the slew rate of a selected input signal 165/170 may be measured and assessed over multiple cycles of the input signal 165/170. In other words, the slew rate signal 320 can be provided as one input to the multiplexer 205 and/or is represented by the selected signal 207 of FIG. 2. The pulse width $W_{pulse}$ may further be reflected in the samples acquired from the data lines of memory 190. Moreover, multiple cycles of a selected input signal, each processed by arrangement 300, 350 and producing pulses in the slew rate signal 320, may be reflected in different address lines of the memory, e.g., by incrementing an associated counter circuit. The samples of different cycles of the slew rate signal 320 may be later accessed and/or analyzed to determine the performance of the associated IC over time, with respect to different workloads and/or operational events, and so forth. Other features and techniques discussed with respect to arrangement 200 may also be beneficially utilized by embodiments combining slew rate signal 320 generation with the arrangement 200.

Referring now to graph 525 of FIG. 5, memory 190 is depicted as having sixteen data lines (Data (0)-Data (15)) and at least three address lines A0, A1, A2. The contents of memory 190 include processed samples of slew rate signal 320 corresponding to multiple cycles of a selected input signal. Each address line A0, A1, A2 includes a sequence of logic "1" values representing the pulse width $W_{pulse}$ in the slew rate signal 320.

Each address line A0, A1, A2 corresponds to samples of a different transition of the selected input signal. In A0, the slew period of the input signal corresponds to a sequence 530A of five "1" samples. In A1, the slew period lengthens to a sequence 530B of six "1" samples. In A2, the slew period returns to a sequence 530C of five "1" samples. The contents of memory 190 may be subsequently accessed to associate the current operational conditions of the integrated circuit with the values and/or changes in the slew rate of the input signal. Further, while A2/data(15) is shown as also including a single "1" value, which could correspond to the beginning of a next pulse in the slew rate signal, the single "1" value may in some cases be disregarded as being incomplete data, spurious data, etc.

Embodiments of the present disclosure may include a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments may be devised without departing from the basic scope thereof, and the scope thereof is determined by the claims that follow.

What is claimed is:

1. A system, comprising:
   a trigger generation module configured to generate a trigger signal; and
   diagnostic circuitry coupled with the trigger generation module, the diagnostic circuitry comprising:
      a fast-switching circuit configured to receive an input signal and produce a first output signal indicating transition in the input signal in response to the input signal exceeding a first voltage threshold;
      a slow-switching circuit configured to receive the input signal and produce a second output signal indicating the transitions in the input signal with a delay compared to the first output signal in response to the input signal exceeding a second voltage threshold greater than the first voltage threshold; and
      an exclusive-OR (XOR) gate configured to receive the first and second output signals and to generate a slew rate signal;
      a memory comprising a plurality of data lines and a plurality of address lines; and
      a plurality of delay elements, each delay element of the plurality of delay elements connected between consecutive data lines of the plurality of data lines, wherein the diagnostic circuitry is configured to:
      receive the slew rate signal on the plurality of data lines; and
      write, upon receiving the trigger signal, values of the slew rate signal carried on the plurality of data lines to at least one address line of the plurality of address lines, thereby acquiring samples of a plurality of cycles of the slew rate signal.

2. The system of claim 1, wherein the diagnostic circuitry further comprises a counter, wherein writing values on the plurality of data lines to the at least one address line of the plurality of address lines comprises:
   writing a first plurality of samples of the slew rate signal to a first address line of the plurality of address lines, the first address line indicated by an initial value of the counter; and
   writing, after incrementing the initial value of the counter, a second plurality of samples of the slew rate signal to a second address line of the plurality of address lines, the second address line indicated by the incremented value.

3. The system of claim 2, wherein the diagnostic circuitry is further configured to combine address information included in the generated trigger signal with the initial value of the counter to select the first address line.

4. The system of claim 2, wherein the diagnostic circuitry is configured to acquire samples of a first cycle of the slew rate signal with the first plurality of samples of the slew rate signal, and to acquire samples of a second cycle of the slew rate signal with the second plurality of samples of the slew rate signal.

5. The system of claim 1, wherein the diagnostic circuitry is included on an integrated circuit, the system further comprising an event detection module configured to:
   determine when one or more predetermined operational conditions of the integrated circuit are met during operation of the integrated circuit; and
   instruct the trigger generation module to generate the trigger signal, thereby signaling the diagnostic circuitry to begin operation.

6. The system of claim 5, wherein the samples of a plurality of cycles of the slew rate signal acquired by the diagnostic circuitry are subsequently associated with the determined one or more predetermined operational conditions and used to dynamically adjust operation of the integrated circuit.

7. The system of claim 5, wherein the diagnostic circuitry further comprises a multiplexer configured to receive a plurality of input signals and configured to receive a select signal to select one of the plurality of input signals, wherein the select signal is based on the determined one or more predetermined operational conditions of the integrated circuit.

8. The system of claim 1, wherein the diagnostic circuitry is configured to determine, based on the acquired samples of a plurality of cycles of the slew rate signal, one or more of a duty cycle and a slew rate of the input signal.

9. The system of claim 1, wherein the first output signal and the second output signal are different from the input signal.

10. An integrated circuit comprising:
a plurality of internal nets, each carrying a respective one of a plurality of signals; and
diagnostic circuitry coupled with at least one of the plurality of internal nets, the diagnostic circuitry comprising:
slew rate diagnostic circuitry configured to generate, based on a selected signal of the plurality of signals, a slew rate signal comprising a pulse having a pulse width, the pulse width indicating a slew rate of the selected signal, wherein the slew rate diagnostic circuitry includes:
a fast-switching circuitry configured to receive the selected signal and produce a first output signal indicating transitions in the selected signal in response to the selected signal exceeding a first voltage threshold;
slow-switching circuitry configured to receive the selected signal and produce a second output signal indicating the transitions in the selected signal with a delay compared to the first output signal in response to the selected signal exceeding a second voltage threshold greater than the first voltage threshold; and
an exclusive-OR (XOR) gate configured to receive the first and second output signals and to generate the slew rate signal;
a memory comprising a plurality of data lines and a plurality of address lines; and
a plurality of delay elements, each delay element of the plurality of delay elements connected between consecutive data lines of the plurality of data lines,
wherein the diagnostic circuitry is configured to write, upon receiving a trigger signal, values on the plurality of data lines to the plurality of address lines, thereby acquiring a plurality of samples of the slew rate signal corresponding to a plurality of transitions of the selected signal.

11. The integrated circuit of claim 10, wherein the diagnostic circuitry further comprises a counter, wherein writing values on the plurality of data lines to the plurality of address lines comprises:
writing a first plurality of samples of the slew rate signal to a first address line of the plurality of address lines, the first address line indicated by an initial value of the counter; and
writing, after incrementing the initial value of the counter, a second plurality of samples of the slew rate signal to a second address line of the plurality of address lines, the second address line indicated by the incremented value.

12. The integrated circuit of claim 11, wherein the diagnostic circuitry is further configured to combine address information included in the received trigger signal with the initial value of the counter to select the first address line.

13. The integrated circuit of claim 11, wherein the diagnostic circuitry is configured to:
acquire, at the first address line, a first plurality of samples of the slew rate signal corresponding to a first transition of the selected signal, and
acquire, at the second address line, a second plurality of samples of the slew rate signal corresponding to a second transition of the selected signal.

14. The integrated circuit of claim 10, further comprising a trigger generation module configured to:
generate the trigger signal responsive to determining one or more predetermined operational conditions of the integrated circuit are met, thereby signaling the diagnostic circuitry to begin operation.

15. The integrated circuit of claim 14, wherein the plurality of samples of the slew rate signal acquired by the diagnostic circuitry are subsequently associated with the determined one or more predetermined operational conditions and used to dynamically adjust operation of the integrated circuit.

16. The integrated circuit of claim 10, wherein the fast-switching circuitry is configured to detect a beginning of a transition of the selected signal, and wherein the slow-switching circuitry is configured to detect an ending of the transition of the selected signal.

17. The integrated circuit of claim 10, wherein the first output signal and the second output signal are different from the selected signal.

18. An integrated circuit comprising:
a plurality of internal nets each carrying a respective one of a plurality of signals;
a fast-switching circuit configured to receive a selected signal of the plurality of signals and to produce a first output signal in response to the selected signal transitioning above a first voltage threshold as a first transition indicator;
a slow-switching circuit configured to receive the selected signal and to produce a second output signal in response to the selected signal above a second voltage threshold that is higher than first voltage threshold as a second transition indicator;
a pulse generating circuit configured to generate a pulse based on the first and second transition indicators; and
diagnostic circuitry comprising a memory having a plurality of data lines and a plurality of address lines, wherein the diagnostic circuitry is configured to acquire a plurality of samples of the generated pulse in the memory.

19. The integrated circuit of claim 18, wherein the diagnostic circuitry further comprises a plurality of delay elements, each delay element of the plurality of delay elements connected between consecutive data lines of the plurality of data lines.

20. The integrated circuit of claim 18, wherein the diagnostic circuitry further comprises a counter, wherein acquiring a plurality of samples of the generated pulse in the memory comprises:
writing a first plurality of samples of a first generated pulse to a first address line of the plurality of address lines, the first generated pulse corresponding to a first transition of the selected signal, the first address line indicated by an initial value of the counter;

writing, after incrementing the initial value of the counter, a second plurality of samples of a second generated pulse to a second address line of the plurality of address lines, the second generated pulse corresponding to a second transition of the selected signal, the second address line indicated by the incremented value.

\* \* \* \* \*